US011586238B1

(12) United States Patent
Mertens et al.

(10) Patent No.: US 11,586,238 B1
(45) Date of Patent: Feb. 21, 2023

(54) CLOCK GENERATOR WITH NOISE REJECTION CIRCUIT

(71) Applicant: NXP B.V., Eindhoven (NL)

(72) Inventors: Robert Matthew Mertens, Austin, TX (US); Ateet Omer, Uttar Pradesh (IN); Sanjay Kumar Wadhwa, Uttar Pradesh (IN); Charles Eric Seaberg, Austin, TX (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/644,356

(22) Filed: Dec. 15, 2021

(51) Int. Cl.
*G06F 1/04* (2006.01)
*H03K 21/08* (2006.01)
*H03M 7/16* (2006.01)
*H03K 5/01* (2006.01)
*H03K 5/00* (2006.01)

(52) U.S. Cl.
CPC ............... *G06F 1/04* (2013.01); *H03K 5/01* (2013.01); *H03K 21/08* (2013.01); *H03M 7/165* (2013.01); *H03K 2005/00078* (2013.01)

(58) Field of Classification Search
CPC . G06F 1/04; H03K 5/01; H03K 21/08; H03K 2005/00078; H03M 7/165
USPC ........................................................ 327/158
See application file for complete search history.

(56) References Cited

U.S. PATENT DOCUMENTS

| 5,289,060 | A | 2/1994 | Elnashar et al. | |
|---|---|---|---|---|
| 6,169,717 | B1* | 1/2001 | Kim | G11B 20/10009 |
| 6,535,057 | B2 | 3/2003 | Chakravarthy | |
| 9,214,943 | B1* | 12/2015 | Gupta | H03K 23/68 |
| 10,574,218 | B2 | 2/2020 | Lin et al. | |
| 10,704,910 | B2* | 7/2020 | Arndt | H03K 5/1565 |
| 11,050,427 | B1* | 6/2021 | Yao | H03K 21/026 |
| 11,264,998 | B1* | 3/2022 | Rachala | G06F 11/3058 |
| 2007/0016816 | A1* | 1/2007 | Himeno | G06F 1/04 |
| | | | | 713/500 |
| 2010/0086089 | A1* | 4/2010 | Fujiwara | H03K 21/38 |
| | | | | 375/354 |
| 2012/0326760 | A1* | 12/2012 | Kesselring | H03K 3/017 |
| | | | | 327/175 |
| 2016/0173106 | A1* | 6/2016 | Gupta | H03K 21/38 |
| | | | | 377/118 |
| 2018/0212608 | A1* | 7/2018 | Neidengard | H03K 23/588 |
| 2021/0221155 | A1* | 7/2021 | Rossi | G06K 15/102 |
| 2022/0069814 | A1* | 3/2022 | Li | H03K 7/08 |

FOREIGN PATENT DOCUMENTS

| EP | 2701308 A2 | 2/2014 |
|---|---|---|
| TW | I532320 B | 5/2016 |

* cited by examiner

*Primary Examiner* — Ryan Jager

(57) ABSTRACT

A clock generator includes an input coupled to receive an input clock signal from a first clock source, and a noise rejection circuit configured to provide an output clock signal based on the input clock signal. The noise rejection circuit includes an event generator having a digital counter circuit. The event generator is configured to generate a first event signal based on a count value of the digital counter circuit, in which the noise rejection circuit is configured to produce an edge on the output clock signal in response to both the event signal and a state of the input clock signal.

18 Claims, 2 Drawing Sheets

CLOCK GENERATOR WITH NOISE REJECTION CIRCUIT

BACKGROUND

Field

This disclosure relates generally to integrated circuits, and more specifically, to a clock generator with a noise rejection circuit.

Related Art

Oscillating signals are commonly used to generate clocks for use in a variety of applications, such as within microprocessors, microcontrollers, etc. In many cases, it is important to maintain an accurate average frequency for a generated clock. However, when the oscillation signal is noisy, the resulting clock signals can be adversely impacted. For example, noise issues may result in such problems as external noise pulses being interpreted as signal from the oscillation source, interference due to high frequency resonance, etc. In some current solutions, noise is filtered out with analog circuitry, such as through the use resistor/capacitor (RC) filters to generate an analog delay. However, these analog solutions are typically large and prone to large delay variation over process, voltage, and temperature (PVT) variation. Therefore, a need exists for a noise rejection circuit which allows for improved clock generation while allowing for reduced area and increased stability.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In the case of an input clock signal, which may be susceptible to noise problems, a noise rejection circuit receives the clock signal and generates a filtered output clock signal which rejects noise on the input clock signal. In one aspect, the generation of the filtered output clock utilizes an internal reference clock signal having a higher frequency than the input clock signal, a delayed clock event generator clocked by the internal reference clock which asserts event signals at some delay after the output clock switches state, and a state machine which is dependent upon the input clock signal and the events generated by the event generator. The delayed clock event generator is implemented using digital logic, including a digital counter. In one embodiment, the digital counter is implemented using a thermometer mode counter, but may be implemented using different types of digital counters.

Figure 1:
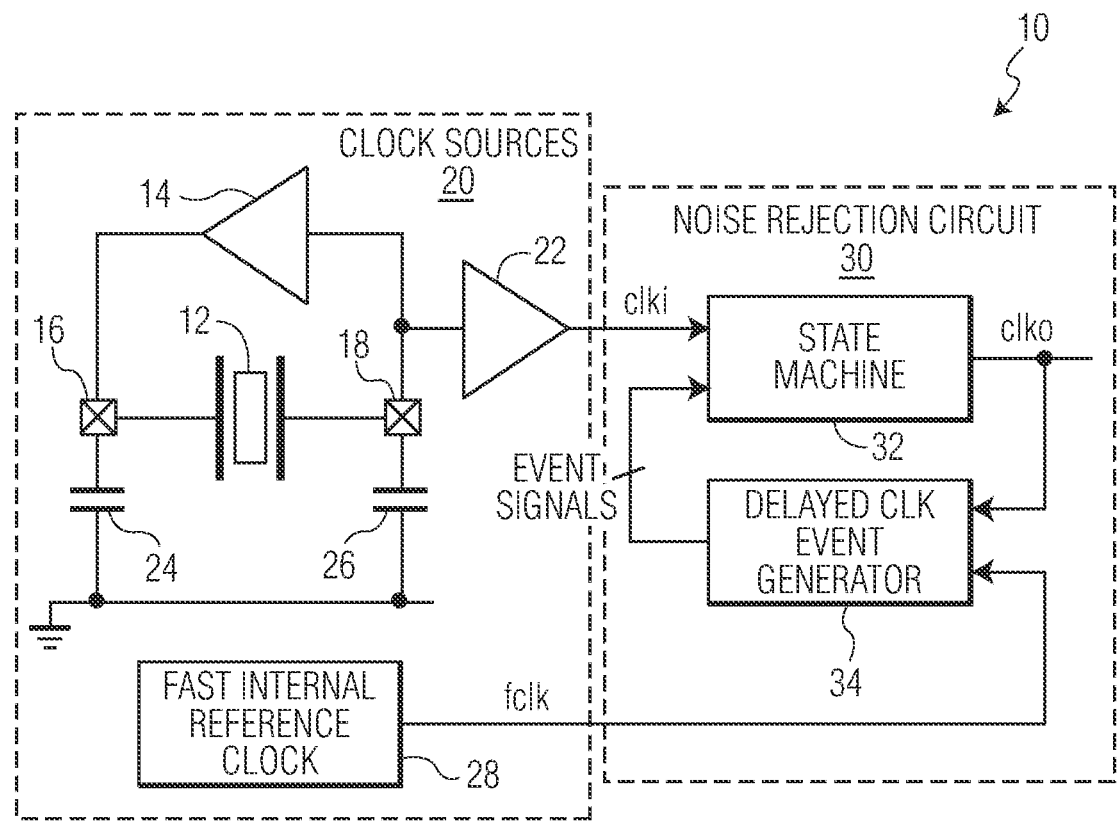
FIG. 1 illustrates, in block diagram form, a clock generator including clock sources and a noise rejection circuit in accordance with one embodiment of the present invention.

FIG. 1 illustrates, in block diagram form, a clock generator 10, in accordance with one embodiment of the present invention, which generates a filtered clock from a noisy clock source. Clock generator 10 includes a noise rejection circuit 30 which filters an input clock signal, clki, to produce a filtered output clock signal, clko. The input clock signal may be received from any clock source, such from a crystal oscillator circuit. For example, as illustrated in FIG. 1, clock sources 20 includes a crystal oscillator circuit coupled to an external crystal 12 at a crystal driver output pad 16 and a crystal driver input pad 18. The crystal oscillator circuit includes an analog amplifier 14 coupled between crystal driver input pad 18 and crystal driver output pad 16, and a clock shaping circuit 22 having an input coupled to crystal driver input pad 18, and an output which provides clki as an input clock to noise rejection circuit 30. In one example, clock shaping circuit 22 behaves like a comparator and provides clki as a logic level one (i.e. as a logic level high) when the voltage at input pad 18 is greater than a predetermined voltage and as a logic level zero (i.e. a logic level low) when the voltage at input pad 18 is less than the predetermined voltage. The oscillator circuit also includes capacitors 24 and 26 coupled between pad 16 and ground and between pad 18 and ground, respectively, to ensure oscillation. Fast internal reference clock circuit 28 provides a fast clock, fclk, to noise rejection circuit 30, whose frequency is significantly higher than that of clki (e.g. at least four times higher or even eight times higher). For example, in one embodiment, clki is a slow 32 kHz clock while fclk can be a 250 kHz clock. Any known circuitry may be used to implement the crystal oscillator circuit and fast internal reference clock 28.

In one embodiment, fast internal reference clock 28 and a portion of the crystal oscillator circuit are located on the same integrated circuit (IC) as noise rejection circuit 30. Crystal 12 and capacitors 24 and 26 are located external to the IC having noise rejection circuit 30. In the illustrated embodiment, the crystal oscillator circuit generates a possibly noisy clock signal which is provided as clki and processed by noise rejection circuit 30. In alternate embodiments, any clock source can be provided as clki, in which any of these sources may produce a noisy clock needing noise filtering.

Noise rejection circuit 30 receives clki and fclk and outputs clko, which may be used as an internal clock for other circuitry located on the IC. The input, clki, is processed with a state machine circuit 32, along with received event signals, to produce clko. The output clko, as well as fclk, is provided to delayed clock (clk) event generator 34 which provides the event signals to state machine circuit 32 based on clko and fclk. For example, delayed clk event generator 34 asserts one or more event signals some delay time (as determined using fclk) after clko switches state. Operation of noise rejection circuit 30 will be described in more detail in reference to FIGS. 2 and 3.

Figure 2:
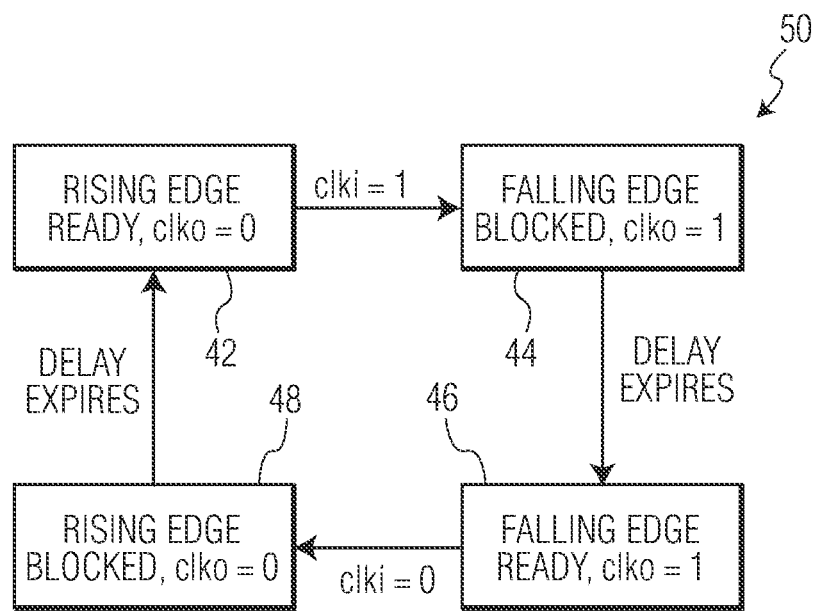
FIG. 2 illustrates, in diagrammatic form, a state machine used by the noise rejection circuit of FIG. 1, in accordance with one embodiment of the present invention.

FIG. 2 illustrates, in diagrammatic form, the states and transitions of a state machine 50 in accordance with one embodiment of the present invention. State machine 50 can be implemented with state machine circuit 32 together with delayed clk event generator 34 of FIG. 1. State machine 50 prevents noisy waveforms at clki (e.g. noisy waveforms at crystal oscillator pins 16 and 18) from corrupting the internal clock output (clko). With state machine 50, since clko is only permitted to toggle once per delay period, only the first rising or falling edge within a predetermined time span is accepted. While this may introduce some jitter, the long-term clock frequency (i.e. the average clock frequency over time) will not experience any substantial shift.

Referring to state machine 50, when in state 42, clko is at zero (i.e. a logic level low) and noise rejection circuit 30 is ready to produce a rising edge in clko (i.e. rising edges of clko are no longer being blocked). Therefore, when clki is one (i.e. a logic level high), state machine 50 transitions to state 44 in which clko is set to one (i.e. producing a rising edge in clko) and subsequent logic zero values of clki are prevented from affecting clko, thus blocking falling edges on clko. The transition to state 44 also initiates a corresponding delay count (performed by a digital counter). Upon the corresponding delay count expiring, state machine 50 transitions to state 46 in which clko is still held at one, but noise rejection circuit 30 is now ready to produce a falling edge on clko (i.e. falling edges of clko are no longer being blocked). Therefore, when clki is zero, state machine 50 transitions to state 48 in which clko is set to zero (i.e. producing a falling edge in clko) and subsequent logic one values of clki are prevented from affecting clko, thus blocking rising edges on clko. The transition to state 48 also initiates a corresponding delay count (also performed by a digital counter and which may be the same or different than the delay count initiated in state 44). Upon the corresponding delay count expiring, state machine 50 transitions to state 42 in which clko is still held at zero, but noise rejection circuit 30 is now again ready to produce a rising edge in clko when clki is one (i.e. rising edges of clko are no longer being blocked).

In one embodiment, the event signals received by state machine circuit 32 from delayed clk event generator 34 includes the signal(s) indicating the transition from state 48 to state 42 or from state 44 to state 46. For example, the event signal(s) may indicate the expiration of the corresponding delay timer(s). Note that these event signal(s) each occur at some delay time after an edge (rising or falling edge) of clko.

Figure 3:
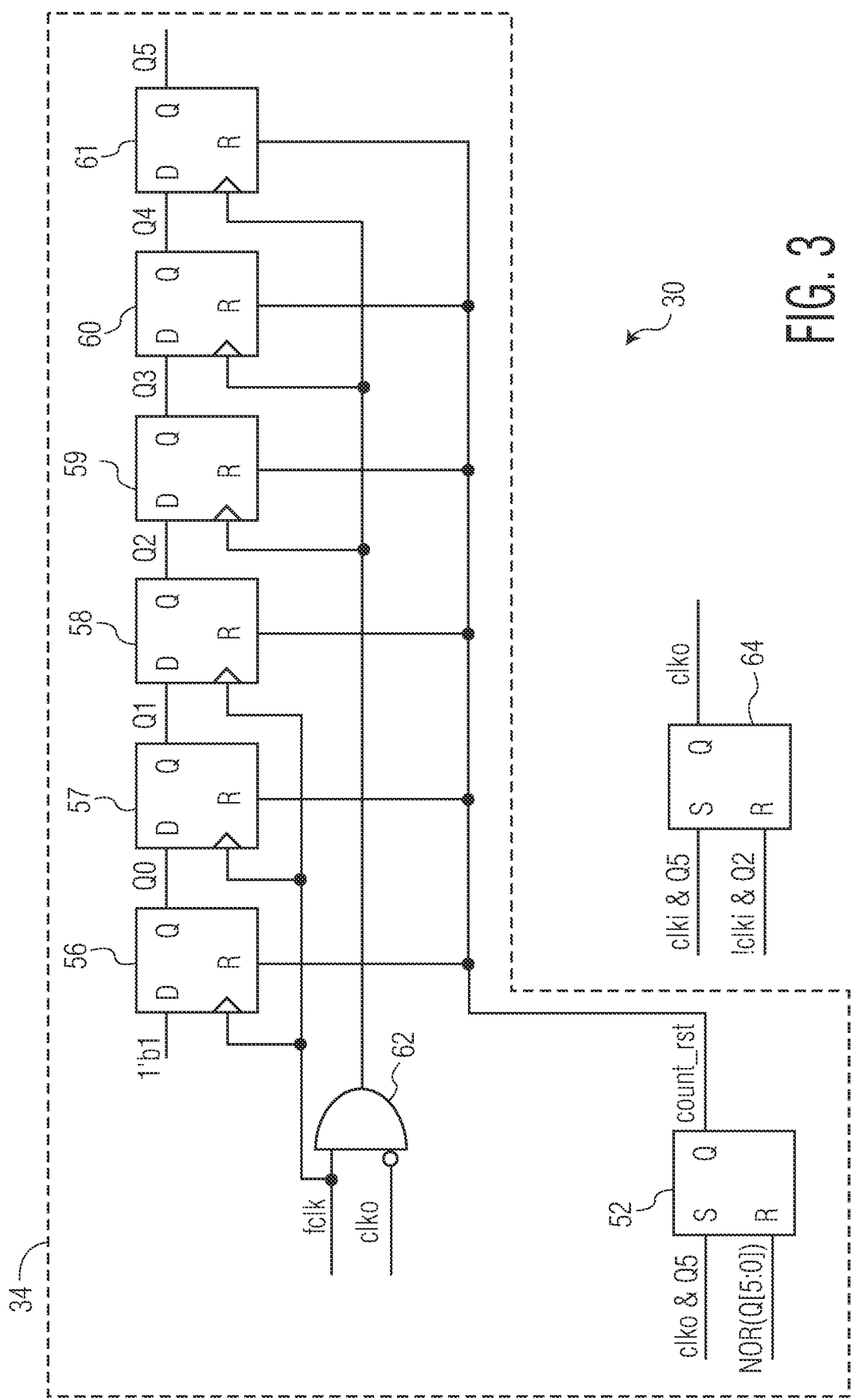
FIG. 3 illustrates, in block diagram form, an implementation of the noise rejection circuit of FIG. 1 with the state machine of FIG. 2, in accordance with one embodiment of the present invention.

FIG. 3 illustrates, in block diagram form, a more detailed view of noise rejection circuit 30, in accordance with one embodiment of the present invention. In the illustrated embodiment, state machine circuit 32 is represented by a set-reset (SR) latch 64 (which generates clko at its output Q), including the logic required to generate the set (S) and reset (R) inputs. The remaining circuitry in FIG. 3 represents delayed clock event generator 34. An SR latch operates asynchronously (e.g. without a clock input) such that when the S input is asserted to a logic level one, the output Q is set to a logic level one, and when the R input is asserted to a logic level one, the output Q is reset is a logic level zero. When neither S nor R are asserted, the output Q remains at its current value. Referring to SR latch 64, SR latch 64 receives "clki AND Q5" at its S input, which, when asserted to a logic level one, results in the output Q (clko) being set to a logic level one. SR latch 64 receives "!clki AND Q2" at its R input, which, when asserted to a logic level one, results in the output Q (clko) being reset to a logic level zero. As used herein, the "!" preceding a signal name, such as clki, indicates the inverse of that signal. Therefore, !clki is equivalent to the inverse of clki or "NOT clki." Any combination of one or more logical gates or circuits can be used to implement the logical functions of "clki AND Q5" and "!clki AND Q2."

In the illustrated embodiment of FIG. 3, event generator 34 is implemented with a thermometer code digital counter, including D flip flops 56-61 which produce a corresponding count value with outputs Q0-Q5, respectively. A data (D) input of flip flop 56 receives a constant logic level one (as indicated by "1'b1" which represents a one-bit value of one), and an output Q provides Q0 to a D input of flip flop 57. An output Q of flip flop 57 provides Q1 to an input D of flip flop 58, an output Q of flip flop 58 provides Q2 to an input D of flip flop 59, an output Q of flip flop 59 provides Q3 to an input D of flip flop 60, an output Q of flip flop 60 provides Q4 to an input D of flip flop 61, and an output Q of flip flop 61 provides an output Q5. Each of D flip flops 56-61 includes an R input which, when asserted to a logic level one, resets the corresponding output Q to a logic level zero. A counter reset signal, count_rst, is provided to the R input of each of flip flops 56-61 such that when count_rst is asserted to a logic level one, the count value of the digital counter resets to all zeros.

Each of the D flip flops is clocked at a corresponding clock input, in which, in response to receiving an active clock edge at the clock input, the input value at input D is propagated as the output value at output Q. In the illustrated embodiment, the active clock edge of the D flip flops is the rising edge, such that the value of D propagates to Q in response to a rising edge at the clock input. Alternatively, the active clock edge can be the falling edge. Each of D flip flops 56-58 receive fclk at the corresponding clock inputs, and each of D flip flops 59-61 receive an output of AND gate 62 at the clock inputs. AND gate 62 receives fclk at a first input, and an inverse of clko (as indicated by the bubble on the input) at a second input.

Event generator 34 also includes an SR latch 52 which receives "clko AND Q5" at its S input, which, when asserted to a logic level one, results in its output Q being asserted to a logic level one, and receives "NOR(Q[5:0])" at its R input, which, when asserted to a logic level one, results in output Q being reset to a logic level zero. The output Q of SR latch 52 provides count_rst to the R inputs of D flip flops 56-61. As used herein, Q[5:0] refers to the six output bits, Q5, Q4, Q3, Q2, Q1, and Q0, respectively, in which Q[5:0] may also be referred to as a counter value or count value. As indicated by "NOR(Q[5:0])," the R input of flip flop 52 is asserted to a logic level one when each of Q0-Q5 is a logic level zero. If one or more of Q0-Q5 is a logic level one, then the R input of flip flop 52 is negated to or remains negated at a logic level zero.

In operation, the signals Q0-Q5 represent a thermometer encoding of the maximum clock phase permitted for clko. A thermometer counter or encoding provides an N-bit count value which is incremented by asserting an additional bit of the N-bit count value to one, such that the number of ones in the N-bit count value increases by one with each count. In the illustrated embodiment, the thermometer count value Q[5:0] is a 6-bit count value which counts from %000000 to %111111 as follows: %000000, %000001, %000011, %000111, %001111, %011111, and %111111. (Note that a "%" preceding a number indicates that the number is represented in its binary or base two form.)

As seen in the embodiment of FIG. 3, the count value Q[5:0]=%000000 aligns with the moment soon after a rising edge of clko. The rising edge of clko causes a brief pulse on count_rst (at the output Q of SR latch 52) to occur. Since Q[5] is still a one prior to reset when the rising edge of clko occurs, count_rst is set to one. This results in a logic level one at all the reset inputs of flip flops 56-61, resetting the flip flops 56-61 to all zeros (such that Q[5:0]=%000000 soon after the rising edge of clko). Upon being reset to zero, NOR(Q[5:0]) is asserted to one, which resets count_rst back to a logic level zero, thus resulting in the brief pulse on count_rst. (Note that the S input or R input of a D flip flop may alter output Q synchronously or asynchronously with the corresponding clock input.) With clko being at a logic level one (corresponding to state 44 of state machine 50), fclk is masked by AND gate 62 from being provided to flop flops 59-61, therefore, fclk is only provided to flip flops 56-58. With each rising edge of fclk, the count value increments by propagating an additional one (initially at the D input flip flop 56) to Q0, then Q1, then Q2 until Q[5:0]=%000111 (indicating that Q0, Q1, and Q2 are all at logic level ones, but Q3-Q5 are still at zero).

At the point that the count value is incremented to 0[5:0]=%000111, Q2 is asserted (i.e. transitions from zero to one). Assertion of Q2 transitions state machine 50 from state 44 (in which logic zero values of clki are prevented from affecting clko) to state 46 (ready to produce a falling edge on clko when clki reaches a first predetermined logic state (clki=0)), in which the time it takes to increment the thermometer count value from %000000 to %000111 (when Q2 is asserted) corresponds to the expiration of the corresponding delay required for transitioning from state 44 to state 46. This delay is set based on the frequency of fclk and the depth of this portion of the counter (corresponding to three flip flops in this example). Note that prior to this assertion of Q2 (i.e. while state machine 50 is still in state 44), SR latch 64 blocks production of falling edges on clko because "!clki AND Q2" remains at zero so long as Q2 is zero, regardless of the value of clki. However, when Q2 is asserted to a logic level one, "!clki AND Q2" at the R input of latch 64 is asserted to a logic level one as soon as clki achieves the first predetermined logic state (e.g. clki=0), at which point clko is reset to zero (generating a falling edge on clko). Therefore, when Q2 is asserted, the counter is halted until clki reaches the first predetermined logic state.

When clko is reset to zero by SR latch 64, state machine 50 transitions from state 46 to state 48 in which logic one values of clki are prevented from affecting clko (since "clki AND Q5" remains at zero so long as Q5 remains at zero, regardless of the value of clki). Also, with clko cleared to zero, AND gate 62 no longer masks fclk such that fclk is provided to each of flip flops 56-61, thus allowing the thermometer counter to continue counting. The count value will increment with each rising edge of fclk by continuing to propagate an additional one to Q3, then Q4, then Q5 until Q[5:0]=%111111. At this point, Q5 is asserted, which transitions state machine 50 from state 48 (in which logic one values of clki are prevented from affecting clko) to state 42 (ready to produce a rising edge on clko when clki reaches a second predetermined logic state (e.g. clki=1)). Similarly, the time it takes to increment the thermometer count value from %000111 to %111111 (when Q5 is asserted) corresponds to the expiration of the corresponding delay required for transitioning from state 48 to state 42. This delay is also set based on the frequency of fclk and the depth of this portion of the counter (corresponding to three flip flops in this example). When Q5 is asserted to a logic level one, "clki AND Q5" at the S input of latch 64 is asserted to a logic level one as soon as clki reaches the second predetermined logic state (e.g. clki=1), at which point clko is set to one by SR latch 64 (thus generating a rising edge on clko), corresponding to the transition from state 42 to state 44. As described above, this rising edge of clko results in a brief pulse on count_rst, which resets the count value back to 0[5:0]=%000000 (corresponding to state 44).

In alternate embodiments, note that a different counter depths may be used for the thermometer counter. For example, while a string of six flip flops is used for the thermometer counter, note that any number of flip flops can be used, as needed, based, e.g., on the frequencies of clki or fclk. Also, in order to make the delay for the falling edges (for transitioning from state 44 to 46) different from the delay for rising edges (for transitioning from state 48 to 42), the depth of each portion of the counter may be different. For example, this may be done by making the number of flip flops which are masked from receiving fclk (e.g. flip flops 59-61) different from those that are not masked (e.g. flip flops 56-58). Alternatively, two separate digital counters may be used for providing the delay for the falling edges and the delay for the rising edges. The digital counter may also not be halted between the different delay counts. Note also that the polarity of the generated output clock, clko, may be the opposite. For example, the transition from state 44 to 46 may instead generate a rising edge in clko, while transition from state 48 to 42 may generate a falling edge in clko. Note that, as used herein, rising edges and falling edges of a clock signal are considered opposite direction edges (e.g. a falling edge is the opposite direction of a rising edge and vice versa).

In one embodiment, signals generated based on count values of the digital counter, such as, for example, Q2 and Q5 in the example of FIG. 3 which control transition from state 44 to 46 and from state 48 to 42, respectively, may be considered event signals which are provided by event generator 34 to state machine circuit 32 of noise rejection circuit 30. Alternatively, different signals from the digital counter may be used as event signals. In other embodiments, note that other digital counters may be used instead of a thermometer code counter. For example, other digital counter types which may be used include a walking-one counter, binary counter, etc. In another embodiment, separate digital counters may be implemented to run concurrently so as to trigger on rising and falling edges of fclk to provide double the time resolution. In various embodiments, different types of signals from these counters may be used as event signals.

Furthermore, many different logical implementations may be used to implement state machine 50 with digital circuitry (without analog circuitry) to properly generate clko from clki. The implementations are also not limited to using D flip flops or SR latches. In one embodiment, state machine 50 may be modified to produce rising and falling edges of clko identically, in which only two states are needed, "ready to produce a next edge" or "values of clki blocked or prevented from affecting clko" in which the transition and delay count are triggered by a toggle of clki. In alternate embodiments, different encodings may be used for the event signals from event generator 34. For example, event generator 34 can provide pulses which may be used to transition from a block state to a ready to produce edge state. Also, any organization of logical gates or other digital circuitry may be used to implement the functions at the inputs of the SR latches. For example, in one embodiment, NOR(Q[5:0]) can be implemented with a single 6-input NOR gate, in which an additional delay circuit may be added between the NOR gate and SR latch 64. For example, the additional delay circuitry may be implemented using an even number of inverters. Alternatively, other combination of gates can be used to implement NOR(Q[5:0]) and to implement the AND functions at the inputs of SR latch 52 and SR latch 64. Note also that state machine circuit 32 may be referred to as control circuitry of noise rejection circuit 30.

Therefore, by now it can be appreciated how a noise rejection circuit with a digital counter may be used to accept any edge but reject subsequent edges for a predetermined delay, in which the predetermined delay is provided by one or more digital counters. In this manner, noisy clock waveforms can be filtered and processed with minimal delay, and may result in reduced long-term frequency drift, as would occur with any analog implementation. By allowing the output clock (e.g. clko) to toggle only once per a predetermined delay time, many noise issues (such as noise pulses or high frequency resonance) can be prevented from affecting the output clock. Digital implementations as described herein may also allow for reduced circuit area and power consumption as compared to analog implementations.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterisk (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Brackets are used herein to indicate the conductors of a bus or the bit locations of a value. For example, "bus 60 [7:0]" or "conductors [7:0] of bus 60" indicates the eight lower order conductors of bus 60, and "address bits [7:0]" or "ADDRESS [7:0]" indicates the eight lower order bits of an address value. The symbol "$" preceding a number indicates that the number is represented in its hexadecimal or base sixteen form. The symbol "%" preceding a number indicates that the number is represented in its binary or base two form.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, different digital counters and digital circuits may be used to implemented the functionality of the state machine. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a clock generator includes an input coupled to receive an input clock signal from a first clock source; and a noise rejection circuit configured to provide an output clock signal based on the input clock signal, wherein the noise rejection circuit includes an event generator having a digital counter circuit, and the event generator is configured to generate a first event signal based on a count value of the digital counter circuit, wherein the noise rejection circuit is configured to produce an edge on the output clock signal in response to both the event signal and a state of the input clock signal. In one aspect of this embodiment, the event generator is configured to assert the first event signal a first delay time after resetting the count value. In a further aspect, the noise rejection circuit is configured to produce a first edge on the output clock signal in response to assertion of the first event signal followed by the input clock signal achieving a first logic state. In yet a further aspect, during the first delay time, the noise rejection circuit is configured to maintain the output clock signal at a first constant logic state regardless of changes in the input clock signal. In yet an even further aspect, the event generator is configured to assert a second event signal a second delay time after producing the first edge on the output clock signal, wherein during the second delay time, the noise rejection circuit is configured to maintain the output clock signal at a second constant logic state regardless of changes in the input clock signal. In yet an even further aspect, the noise rejection circuit is configured to produce a second edge, opposite direction of the first edge, on the output clock signal in response to assertion of the second event signal followed by the input clock signal achieving a second logic state, different from the first logic state. In another even further aspect, the first delay time and the second delay time have different time durations. In another aspect of the above embodiment, the digital counter circuit is configured to count with respect to a fast clock which has a higher frequency as compared to a frequency of the input clock source. In yet another aspect of the above embodiment, the event generator is configured to assert the first event signal a first delay time from the noise rejection circuit producing an edge on the output clock signal. In a further aspect, the noise rejection circuit is configured to produce a subsequent edge on the output clock signal, opposite direction of the edge, in response to assertion of the first event signal followed by the input clock signal achieving a first logic state. In an even further aspect, the subsequent edge corresponds to a transition from a second logic state to the first logic state. In another aspect, the digital counter circuit includes one of a thermometer code counter, a walking-one counter, and a binary counter.

In another embodiment, a clock generator includes an input coupled to receive an input clock signal from a first clock source; and a noise rejection circuit configured to generate an output clock signal based on the input clock signal, in which the noise rejection circuit includes a digital counter, and the noise rejection circuit is configured to, in response to generating a first edge in the output clock signal, maintain the output clock signal at a first constant logic state for a first delay time indicated by the digital counter, and, in response to the first delay time expiring, generate an immediately subsequent edge in the output clock signal, opposite direction of the first edge, when the input clock signal achieves a first predetermined logic state. In one aspect of the another embodiment, the digital counter counts the first delay time using a clock whose frequency is faster than a frequency of the first clock source. In an other aspect, the noise rejection circuit is configured to maintain the output clock at the first constant logic state for the first delay time indicated by the digital counter regardless of changes in logic state of the input clock signal. In a further aspect, the noise rejection circuit includes a second timer, and the noise rejection circuit further configured to, in response to generating the immediately subsequent edge in the output clock signal, maintain the output clock signal at a second constant logic state, opposite the first constant logic state, for a second delay time indicated by a second digital counter, and, in response to the second delay time expiring, generate a next immediately subsequent edge in the output clock signal, opposite direction of the immediately subsequent edge, when the input clock signal achieves a second predetermined logic state, opposite the first predetermined logic state. In yet a further aspect, the noise rejection circuit is configured to maintain the output clock at the second constant logic state for the second delay time indicated by the second digital counter regardless of changes in logic state of the input clock signal. In yet an even further aspect, the first delay timer and the second delay timer are different portions of a thermometer code digital counter. In another aspect, the first delay timer and the second delay timer are two separate digital counters. In yet another aspect, the noise rejection circuit is configured to halt the digital counter from counting from when the first delay time expires until the input clock signal achieves the first predetermined logic state.

What is claimed is:

1. A clock generator, comprising:
   an input coupled to receive an input clock signal from a first clock source; and
   a noise rejection circuit configured to provide an output clock signal based on the input clock signal, the noise rejection circuit comprising:
      an event generator having a digital counter circuit, the event generator configured to generate a first event signal based on a count value of the digital counter circuit, wherein the noise rejection circuit is configured to produce an edge on the output clock signal in response to both the event signal and a state of the input clock signal, and wherein the digital counter circuit is configured to count with respect to a fast clock which has a higher frequency as compared to a frequency of the first clock source.

2. The clock generator of claim 1, wherein the event generator is configured to assert the first event signal a first delay time after resetting the count value.

3. The clock generator of claim 2, wherein the noise rejection circuit is configured to produce a first edge on the output clock signal in response to assertion of the first event signal followed by the input clock signal achieving a first logic state.

4. The clock generator of claim 3, wherein during the first delay time, the noise rejection circuit is configured to maintain the output clock signal at a first constant logic state regardless of changes in the input clock signal.

5. The clock generator of claim 4, wherein the event generator is configured to assert a second event signal a second delay time after producing the first edge on the output clock signal, wherein during the second delay time, the noise rejection circuit is configured to maintain the output clock signal at a second constant logic state regardless of changes in the input clock signal.

6. The clock generator of claim 5, wherein the noise rejection circuit is configured to produce a second edge, opposite direction of the first edge, on the output clock signal in response to assertion of the second event signal followed by the input clock signal achieving a second logic state, different from the first logic state.

7. The clock generator of claim 1, wherein the event generator is configured to assert the first event signal a first delay time from the noise rejection circuit producing an edge on the output clock signal.

8. The clock generator of claim 7, wherein the noise rejection circuit is configured to produce a subsequent edge on the output clock signal, opposite direction of the edge, in response to assertion of the first event signal followed by the input clock signal achieving a first logic state.

9. The clock generator of claim 8, wherein the subsequent edge corresponds to a transition from a second logic state to the first logic state.

10. The clock generator of claim 1, wherein the digital counter circuit comprises one of a thermometer code counter, a walking-one counter, and a binary counter.

11. A clock generator, comprising:
   an input coupled to receive an input clock signal from a first clock source; and
   a noise rejection circuit configured to provide an output clock signal based on the input clock signal, the noise rejection circuit comprising:
      an event generator having a digital counter circuit, the event generator configured to generate a first event signal based on a count value of the digital counter circuit, wherein the noise rejection circuit is configured to produce an edge on the output clock signal in response to both the event signal and a state of the input clock signal,
   wherein the event generator is configured to assert the first event signal a first delay time after resetting the count value,
   wherein the noise rejection circuit is configured to produce a first edge on the output clock signal in response to assertion of the first event signal followed by the input clock signal achieving a first logic state, and during the first delay time, the noise rejection circuit is configured to maintain the output clock signal at a first constant logic state regardless of changes in the input clock signal,
   wherein the event generator is configured to assert a second event signal a second delay time after producing the first edge on the output clock signal, wherein during the second delay time, the noise rejection circuit is configured to maintain the output clock signal at a second constant logic state regardless of changes in the input clock signal, and wherein the first delay time and the second delay time have different time durations.

12. A clock generator, comprising:

an input coupled to receive an input clock signal from a first clock source; and a noise rejection circuit configured to generate an output clock signal based on the input clock signal, the noise rejection circuit comprising:

a digital counter, wherein the noise rejection circuit is configured to:

in response to generating a first edge in the output clock signal, maintain the output clock signal at a first constant logic state for a first delay time indicated by the digital counter, and in response to the first delay time expiring, generate an immediately subsequent edge in the output clock signal, opposite direction of the first edge, when the input clock signal achieves a first predetermined logic state, wherein the digital counter counts the first delay time using a clock whose frequency is faster than a frequency of the first clock source.

13. The clock generator of claim 12, wherein the noise rejection circuit is configured to maintain the output clock at the first constant logic state for the first delay time indicated by the digital counter regardless of changes in logic state of the input clock signal.

14. The clock generator of claim 12, wherein the noise rejection circuit is configured to halt the digital counter from counting from when the first delay time expires until the input clock signal achieves the first predetermined logic state.

15. A clock generator, comprising:

an input coupled to receive an input clock signal from a first clock source; and a noise rejection circuit configured to generate an output clock signal based on the input clock signal, the noise rejection circuit comprising:

a digital counter and a second digital counter, wherein the noise rejection circuit is configured to:

in response to generating a first edge in the output clock signal, maintain the output clock signal at a first constant logic state for a first delay time indicated by the digital counter, regardless of changes in logic state of the input clock signal, in response to the first delay time expiring, generate an immediately subsequent edge in the output clock signal, opposite direction of the first edge, when the input clock signal achieves a first predetermined logic state, in response to generating the immediately subsequent edge in the output clock signal, maintain the output clock signal at a second constant logic state, opposite the first constant logic state, for a second delay time indicated by the second digital counter, and in response to the second delay time expiring, generate a next immediately subsequent edge in the output clock signal, opposite direction of the immediately subsequent edge, when the input clock signal achieves a second predetermined logic state, opposite the first predetermined logic state.

16. The clock generator of claim 15, wherein the noise rejection circuit is configured to maintain the output clock at the second constant logic state for the second delay time indicated by the second digital counter regardless of changes in logic state of the input clock signal.

17. The clock generator of claim 16, wherein the digital counter and the second digital counter are different portions of a thermometer code digital counter.

18. The clock generator of claim 16, wherein the digital counter and the second digital counter are two separate digital counters.

* * * * *